US008405462B2

(12) United States Patent
Martineau et al.

(10) Patent No.: US 8,405,462 B2
(45) Date of Patent: Mar. 26, 2013

(54) PHASE-SHIFT AMPLIFIER

(75) Inventors: Baudouin Martineau, Grenoble (FR); Olivier Richard, Bilieu (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 13/006,253

(22) Filed: Jan. 13, 2011

(65) Prior Publication Data

US 2011/0169572 A1 Jul. 14, 2011

(30) Foreign Application Priority Data

Jan. 14, 2010 (FR) ...................................... 10 50249

(51) Int. Cl.
*H03F 1/22* (2006.01)
(52) U.S. Cl. ...................................................... 330/311
(58) Field of Classification Search .................. 330/286, 330/295, 311
See application file for complete search history.

(56) References Cited

U.S. PATENT DOCUMENTS

| | | | | |
|---|---|---|---|---|
| 6,472,936 | B1 * | 10/2002 | Jones ............................... | 330/51 |
| 6,580,326 | B2 * | 6/2003 | Bach et al. ..................... | 330/277 |
| 7,580,674 | B2 * | 8/2009 | Gorsuch et al. ................. | 455/25 |
| 7,936,220 | B2 * | 5/2011 | Li et al. .......................... | 330/311 |
| 7,962,174 | B2 * | 6/2011 | Lipowski et al. ............. | 455/561 |
| 2001/0050589 | A1 | 12/2001 | Baudelot et al. | |
| 2003/0181181 | A1 | 9/2003 | Darabi | |
| 2004/0066236 | A1 | 4/2004 | Fujimoto et al. | |
| 2009/0212870 | A1 * | 8/2009 | Chen et al. .................... | 330/295 |

FOREIGN PATENT DOCUMENTS

WO WO 2008102788 A1 8/2008

OTHER PUBLICATIONS

French Search Report dated Aug. 26, 2010 from corresponding French Application No. 10/50249.
Sanggeun Jeon et al:, *A Scalable 6-to-18 GHz Concurrent Dual-Band Quad-Beam Phased-Array Receiver in CMOS*, IEEE Journal of Solid-State Circuits, IEEE Service Center, Piscataway, NJ, US LNKD-001:10.1109/JSSC.2008.2004863, vol. 43, No. 12, Dec. 1, 2008, pp. 2660-2673, XP011238675.

* cited by examiner

*Primary Examiner* — Steven J Mottola
(74) *Attorney, Agent, or Firm* — Wolf, Greenfield & Sacks, P.C.

(57) ABSTRACT

A cascode amplifier comprising at least two phase-shift stages controllable between an input transistor having a control terminal connected to an input terminal of the amplifier, and an output terminal of the amplifier.

8 Claims, 4 Drawing Sheets

PHASE-SHIFT AMPLIFIER

CROSS REFERENCE TO RELATED APPLICATIONS

This application claims the priority benefit of French patent application number 10/50249, filed on Jan. 14, 2010, entitled "Phase-Shift Amplifier," which is hereby incorporated by reference to the maximum extent allowable by law.

BACKGROUND OF THE INVENTION

1. Field of the Invention

The present invention generally relates to electronic circuits and, more specifically, to radio frequency transmit/receive chains.

The present invention more specifically applies to beamforming transmission chains intended for adaptive antennas.

2. Discussion of the Related Art

Radio frequency transmit/receive chains are quasi systematically equipped with variable-gain amplifiers and, more and more often, associated with phase-shifters to direct the radiation of an adaptive antenna.

The use of adaptive antennas enables to create a resulting beam in the direction of the transmitter or of the receiver and to focus the transmission to, for example, increase the range in the direction of the other system with which the transmit chain communicates.

Adaptive antennas are generally formed of several directional antennas, each individually associated with a transmit or receive path. Each path comprises a phase-shifter to adjust the phase of the signal sent to the corresponding antenna. The different paths are individually controllable according to the direction desired for the transmission.

A known technique comprises shifting the phase of the signals of the modulation or demodulation carrier (local oscillator). As many modulators (or demodulators) as paths are then necessary, which generates a significant power consumption due to the number of required amplifiers and circuits.

Another known technique comprises shifting the phase of the signals in baseband, that is, the analog signals after the demodulation (in receive mode) or before the modulation (in transmit mode). Here again, as many modulators as paths should be provided.

Another technique comprises shifting the phase of the radio signals after a modulation or before a demodulation. The phase shifters are then formed in distributed lines associated with switches, which is also bulky.

SUMMARY OF THE INVENTION

An object of an embodiment of the present invention is to provide a beamforming radio frequency transmission chain which overcomes all or part of the disadvantages of current techniques.

Another object of the present invention is a solution of lower power consumption and less bulky than usual techniques.

Another object of the present invention more generally is to provide a variable-phase phase-shift amplifier.

Another object of an embodiment of the present invention is an amplifier with a variable phase and gain.

To achieve all or part of these objects as well as others, at least one embodiment of the present invention provides a cascode amplifier comprising at least two phase-shift stages controllable between an input transistor having a control terminal connected to an input terminal of the amplifier, and an output terminal of the amplifier.

According to an embodiment of the present invention, each phase-shift stage comprises a gain element in series with a delay element between said output terminal and said input transistor, each delay element connecting the midpoint of said series connection to the delay element of the stage of previous rank.

According to an embodiment of the present invention, each gain element comprises at least one transistor connecting said output terminal to the delay element of the corresponding stage.

According to an embodiment of the present invention, each gain element comprises several transistors in parallel to make the amplifier gain settable.

According to an embodiment of the present invention, the transistors of the gain elements are MOS transistors.

According to an embodiment of the present invention, the input transistor is a common-source MOS transistor.

According to an embodiment of the present invention, the input transistor is a common-emitter bipolar transistor.

The present invention also provides a radio frequency transmission chain with an adaptive antenna, comprising at least one phase-shift amplifier.

According to an embodiment of the present invention, the transmission chain comprises:

on the transmit side, a first phase-shift amplifier forming a first stage of a transmit amplifier; and on the receive side, a second phase-shift amplifier forming a last stage of a low-noise amplifier.

The foregoing objects, features, and advantages of the present invention will be discussed in detail in the following non-limiting description of specific embodiments in connection with the accompanying drawings.

DETAILED DESCRIPTION

Figure 1:
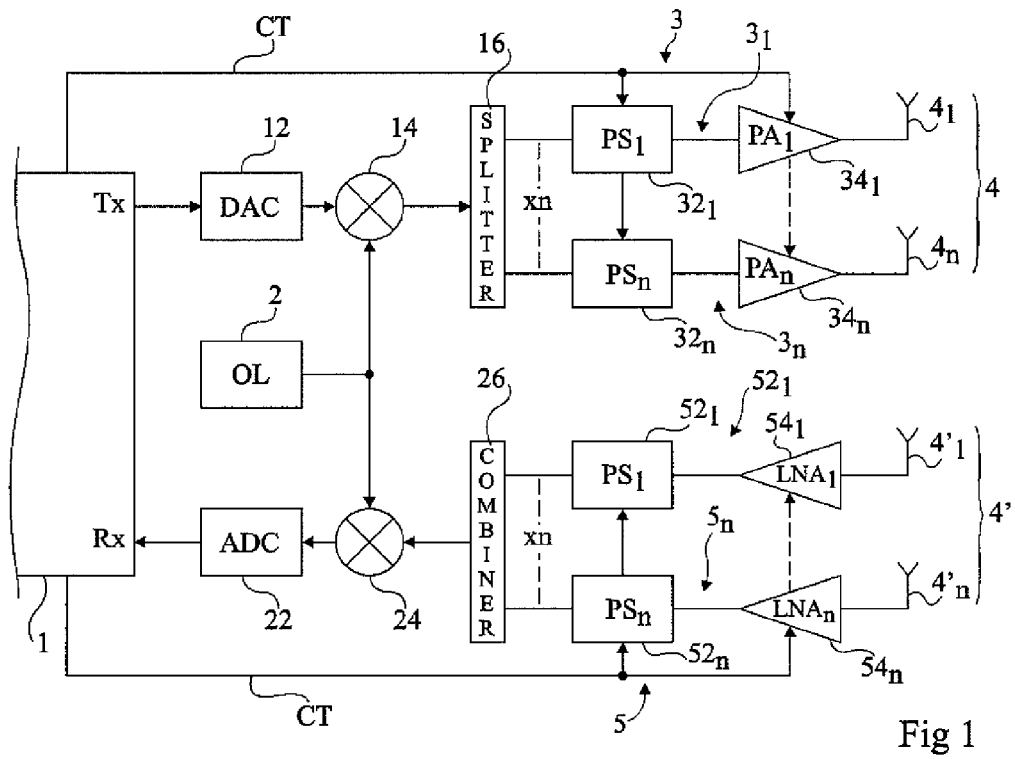
FIG. 1 is a block diagram of an embodiment of a transmit system of the type to which the present invention applies as an example.

The same elements have been designated with the same reference numerals in the different drawings. For clarity, only those elements which are useful to the understanding of the present invention have been shown and will be described. In particular, the generation of the signals to be transmitted and the exploitation of the received signals have not been detailed, the present invention being compatible with any usual transmission chain. Further, the forming of the adaptive antennas or of the antenna networks exploitable with the embodiments which will be described has not been detailed, the present invention requiring no modification of such adaptive antennas or antenna networks.

At least one embodiment of the present invention will be described hereafter in relation with an example of application of a radio frequency transmission chain. It should be noted that it however more generally applies to the forming of a variable-phase phase-shift amplifier. For example, the present invention applies to superheterodyne-type receivers, to direct conversion chains, to pulse radio chains, etc.

FIG. 1 is a block diagram of an embodiment of a radio frequency transmission system of the type to which the present invention applies as an example.

On the transmit side, a signal Tx to be transmitted is shaped by an electronic transmission circuit 1. This circuit, for example, is a microcontroller or any other circuit for shaping data to be transmitted. The digital signal originating from circuit 1 is converted by a digital-to-analog converter 12 (DAC) to be used as a modulation signal for a carrier provided by a local oscillator 2 (OL) to a modulator 14. The output of modulator 14 is sent onto an amplification and beamforming circuit 3 having the function of adapting the gain and the phase of the signal to focus the transmission of an adaptive antenna towards the receiver for which the transmission is intended.

In the example of FIG. 1, the use of an array 4 of several (n) adaptive antennas $4_1, \ldots, 4_n$ having a limited radiation is assumed. Accordingly, circuit 3 comprises as many (n) paths $3_1, \ldots, 3_n$ as array 4 comprises adaptive antennas. However, as will be seen hereafter, the number of paths of the array depends on the radiation angle of the antenna. A signal path (n=1) is sufficient for an omnidirectional adaptive antenna. In the case of several antennas, the signal originating from modulator 14 crosses a splitter 16 to distribute the signal towards all paths $3_i$ (with i ranging from 1 to n).

Each transmission path comprises a phase-shift amplifier $32_i$ ($32_1, \ldots, 32_n$-$PS_1, \ldots, PS_n$) associated with a power amplifier $34_i$ ($34_1, \ldots, 34_n$-$PA_1, \ldots, PA_n$). As will be seen hereafter, the phase-shift circuit preferentially forms a stage of the transmit amplifier. The output of each transmit amplifier (path $3_i$) is sent onto antenna $4_i$ of the concerned path. Phase-shift amplifiers $32_i$ and power amplifiers $34_i$ receive, from microcontroller 1, control signals CT intended to set the phase and the gain. These control signals are generated from measurements performed by couplers (not shown) interposed on the transmission lines, generally as close as possible to the antennas.

On the receive side, an array 4' of similar antennas $4'_1, \ldots, 4'_n$ detects a signal. These antennas have been shown as separate from the transmission antennas but may be the same for the transmission and the reception. This is why their number is identical. The detected signal is transmitted to an amplification and beamforming circuit 5 comprising n (n being greater than or equal to 1) receive paths, each provided with a low-noise amplifier $54_i$ ($54_1, \ldots, 54_n$-$LNA_1, \ldots LNA_n$) followed by a phase-shifter $52_i$ ($52_1, \ldots, 52_n$-$PS_1, \ldots, PS_n$). As will be seen hereafter, the phase-shift circuit preferentially forms a stage of the low-noise amplifier. The outputs of amplifiers-phase shifters $52_i$ are sent onto a combiner 26 having its output sent onto a demodulator 24 also receiving the signal originating from local oscillator 2. The output of demodulator 24 is converted by an analog-to-digital converter 22 (ADC) having its output sent onto microcontroller 1 (signal Rx). As for the transmission, the amplifiers (low noise and phase shifter) receive control signals CT from microcontroller 1 to adjust the phase and the gain.

Since the reception beam has the same direction as the transmission beam, microcontroller 1 selects the same phase-shift in transmit and in receive mode.

Although this has not been shown, be it on the transmit or receive side, other impedance matching, coupling, etc. circuits are present in the transmit/receive chains.

Figure 2:
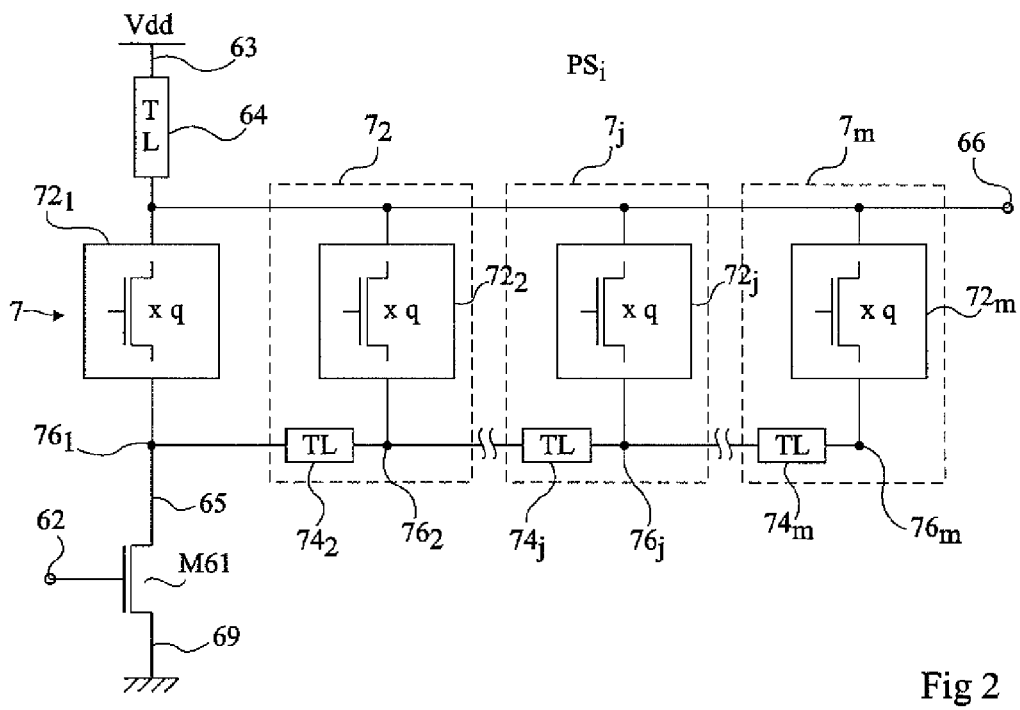
FIG. 2 shows an embodiment of a phase-shift amplifier according to the present invention.

FIG. 2 shows an embodiment of a phase-shift amplifier $PS_i$. The structure described in relation with FIG. 2 may indifferently form one of transmit $32_i$ or receive $52_i$ phase-shift amplifiers of the system of FIG. 1.

The architecture of this circuit is based on a cascode-type structure. A common-source MOS transistor M61 (source connected to a ground terminal 69) receives, on its gate, the signal to be amplified/phase-shifted, which originates from an input terminal 62 of the circuit. Drain 65 of transistor M61 is connected to a circuit 7 setting the phase and the gain, in series with a load 64 (for example, a transmission line TL) between drain 65 of transistor M61 and a terminal 63 of application of a positive power supply voltage (Vdd). The junction point of load 64 and of stage 7 defines an output terminal 66 of the phase-shift amplifier.

Circuit 7 comprises, in parallel between drain 65 of transistor M61 and terminal 66, a number m of phase-shift stages bearing reference numerals $7_j$ (j ranging between 2 and m) according to the number of phase shifts provided for the phase-shift circuit. Each phase-shift stage $7_j$ comprises a gain element $72_i$ in series with a delay element $74_i$ between output terminal 66 and midpoint $76_{j-1}$ of the series association of the phase-shift stage $7_{j-1}$ of lower rank. Each delay element $74_j$ is formed, for example, of a transmission line (TL) having its length depending of the phase-shift between two cones of the beam to be formed, the delay introduced by first stage $7_1$ being zero (in practice, limited to a negligible propagation delay between the drain of transistor 62 and gain element $72_1$). A single gain element is made conductive at once. This sets the number of delay elements $74_j$ in series between drain 65 of common-source transistor M61 and output terminal 66.

Figure 3:
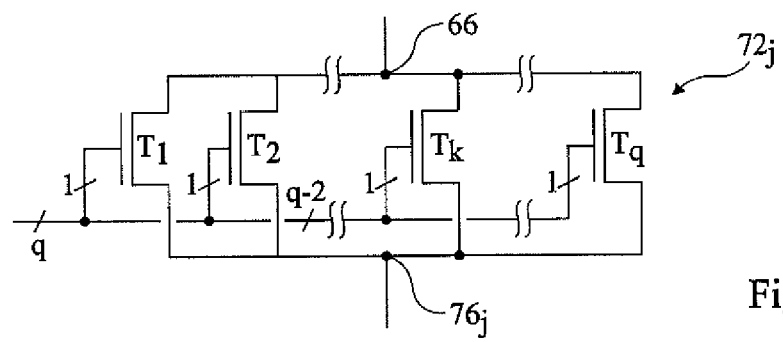
FIG. 3 shows the electric diagram of a switching element of the amplifier of FIG. 2.

FIG. 3 shows an example of an electric diagram of a gain element $72_j$.

Each gain element $72_j$ comprises q transistors $T_1, T_2, \ldots T_k, \ldots T_q$ connected in parallel between terminal 66 and node $76_j$ of the concerned phase-shift stage. Transistors $T_k$ (with k ranging from 1 to q) of gain elements $72_j$ are individually controllable from microcontroller 1 to select the gain. For example, the sizes of transistors $T_1$ to $T_q$ are different and a single transistor $T_k$ is made conductive between terminal 66 and the drain of transistor M61. In this case, each element $72_j$ comprises as many transistors in parallel as there are possible gain levels. According to another example, several transistors of element $72_j$ are made conductive to be in parallel between terminal 66 and the concerned delay element $74_j$. In this case, the respective sizes of transistors $T_k$ may be identical. These two examples may for example be combined.

In a simplified embodiment where the circuit of FIG. 2 only has a variable phase, each gain element $72_j$ comprises a MOS transistor (or several transistors, in parallel but controlled simultaneously).

Preferably, the number of phase-shift stages $7_j$ in circuit $PS_i$ ranges between 2 and 64, and number q of transistors of each element $72_j$ ranges between 2 and 8.

It could have been devised to interpose delay elements in the high portion of the assembly (between the nodes of connection of the stages to terminal 66). However, this would result in mismatching the output impedance of the amplifier according to the phase-shift. The presence of delay elements $74_j$ in the low portion of the assembly (connected to the drain of transistor M61) enables not to mismatch the output impedance of the amplifier.

Figure 4:
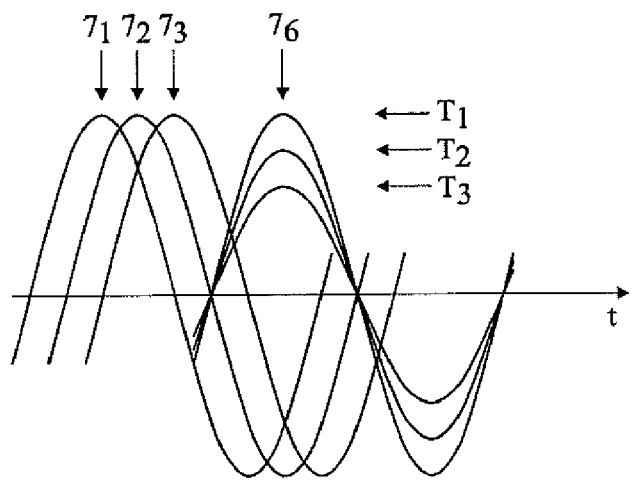
FIG. 4 illustrates, with simplified shapes of a signal, the operation of the phase-shift amplifier of FIG. 2.

FIG. 4 illustrates the operation of the circuit of FIG. 2, for an example, comprising eight stages $7_j$ (m=8), each gain element comprising three transistors $T_k$ (q=3).

On a time scale t, a signal which is not phase-shifted (identified by stage $7_1$) becomes more and more phase-shifted as the rank of the selected stage $7_j$ increases. It is assumed in this example that the delays introduced by the different elements $74_j$ have the same duration, which will most often occur to have a homogeneous distribution of the lobes of the adaptive antenna.

The influence of the selection of one of the three transistors $T_k$ of the selected stage translates as an amplitude variation, illustrated on signal $7_6$. In this example, it is assumed that a single transistor $T_k$ is selected at once and that the size (ratio W/L) of the transistors decreases from transistor $T_1$ to transistor $T_3$.

Figure 5:
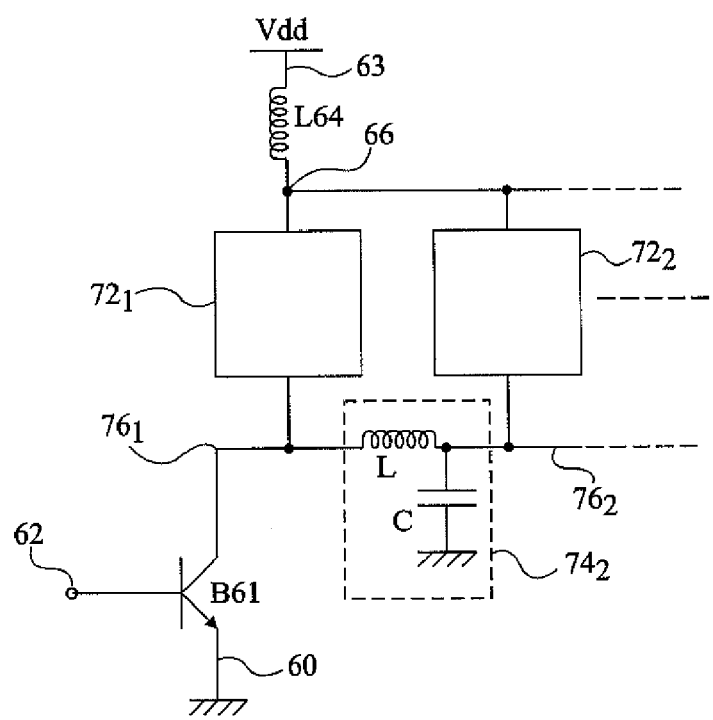
FIG. 5 is a partial block diagram illustrating alternative embodiments of the phase-shift amplifier of FIG. 2.

FIG. 5 partially shows another embodiment of a phase-shift amplifier.

A first difference with respect to the embodiment of FIG. 2 is that common-source transistor M61 is replaced with a common-emitter bipolar transistor B61 (emitter connected to ground—terminal 69) having its base connected to terminal 62 and having its collector connected to node $76_1$.

Another difference is that delay elements $74_j$ (only element $74_2$ is shown in FIG. 5) are formed of discrete circuits comprising an inductance L between nodes $76_{j-1}$ and $76_j$ and a capacitor C between node $76_j$ and the ground. The inductances and capacitors are preferentially identical in the different stages for the lobes to be properly distributed.

Still another difference is that load 64 is formed by an inductance L64.

The differences discussed in the embodiment of FIG. 5 with respect to that of FIG. 2 may of course be combined.

Figure 6:
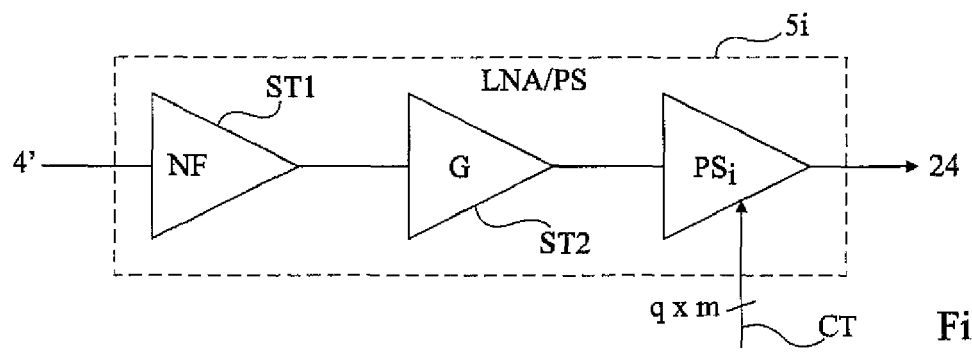
FIG. 6 schematically shows an embodiment of a low-noise receive amplifier.

FIG. 6 schematically shows a preferred embodiment of a receive amplifier $5_i$ associating low-noise amplifier LNA and a variable-gain phase shifter PS. Generally, a low-noise amplifier comprises several successive stages. In this case, the last stage is preferably formed of circuit $PS_i$ described in relation with FIG. 2. For example, a first stage ST1 (NF— Noise Figure) with a low noise figure to optimize the signal-to-noise ratio. A second stage ST2 provides a fixed gain (G) to the amplifier. The third stage is formed of phase-shift amplifier $PS_i$.

An advantage of placing the phase-shift amplifier at the last stage of the low-noise amplifier is that this does not disturb the previous stages, especially the noise measurement stage.

Figure 7:
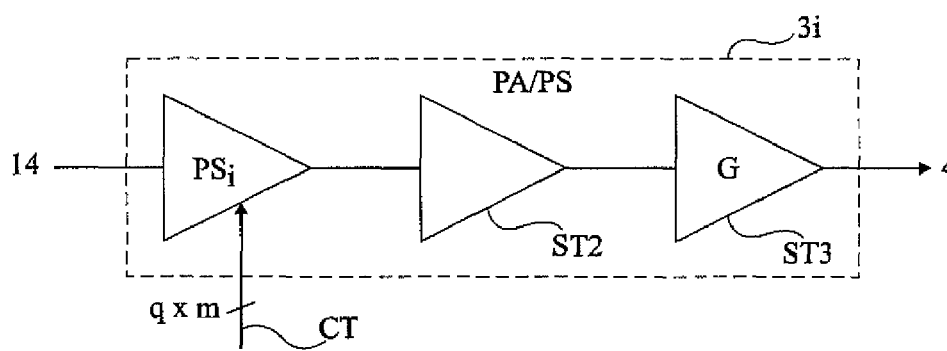
FIG. 7 schematically shows an embodiment of a transmit amplifier.

FIG. 7 schematically shows a transmit amplifier $3_i$ according to a preferred embodiment where the phase-shift amplifier of FIG. 2 forms a first stage of the transmit amplifier. This first stage is generally followed by an intermediary stage ST2 and by a third stage ST3 providing a fixed gain. Providing the phase-shift at the input of the transmit amplifier helps maintain the linearity of the signal.

In FIGS. 6 and 7, a control signal CT over q*m bits has been illustrated. However, the control signal may also be dissociated into a signal over m bits for selecting a single element $7_j$ and a signal over q bits for selecting one or several transistors $T_k$.

Figure 8A:
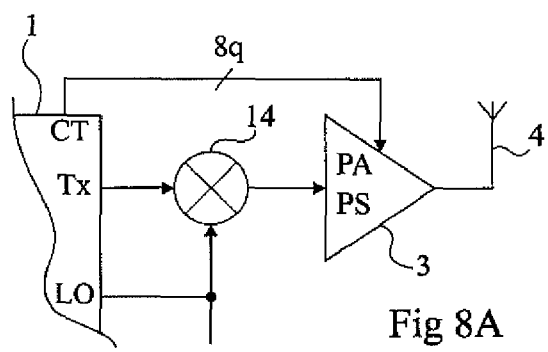
FIGS. 8A and 8B partially and schematically show an embodiment of a transmission chain for an omnidirectional adaptive antenna and the obtained beamforming.
Figure 8B:
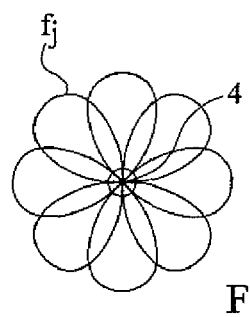

FIGS. 8A and 8B schematically illustrate an example of application of the phase-shift amplifier to an omnidirectional adaptive antenna 4. FIG. 8A partially shows the transmit portion. FIG. 8B illustrates the obtained lobes or beams $f_j$. Signal Tx to be transmitted, after having been converted to analog (converter not shown) is modulated (modulator 14) and drives a single transmit amplifier 3 comprising as many phase-shift elements $7_j$ as there are desired lobes for the antenna. In this example, it is assumed that amplifier 3 defines eight transmit lobes for antenna 4. Microcontroller 1 accordingly provides 8q control signals CT to select both the phase shift and the gain.

Figure 9A:
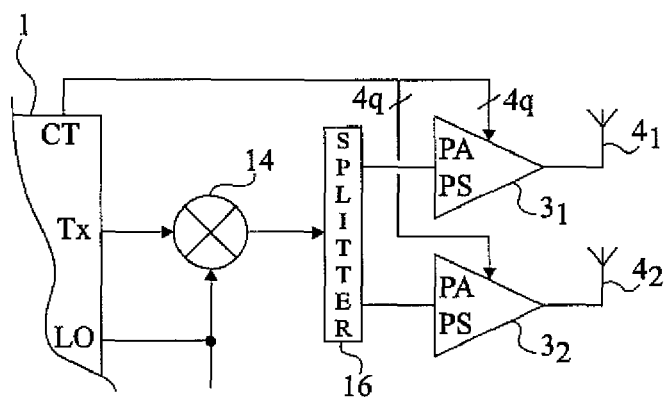
FIGS. 9A and 9B partially and schematically show an embodiment of a transmission chain for two adaptive antennas, each radiating over 180° and the obtained beamforming.
Figure 9B:
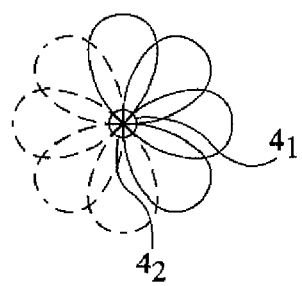

FIGS. 9A and 9B schematically illustrate another example of application to a transmission chain intended to supply two adaptive antennas $4_1$ and $4_2$ radiating over 180° and arranged head-to-tail. FIG. 9A partially shows the transmit portion. FIG. 9B illustrates the obtained lobes or beams $f_j$. Each antenna $4_i$ (n=2) is supplied over a path $3_1$ or $3_2$ from splitter 16. Microcontroller 1 provides 4q control signals to each of phase-shift amplifiers $3_1$ and $3_2$. Two omnidirectional antennas with beams interposed two-by-two may also be provided.

Figure 10:
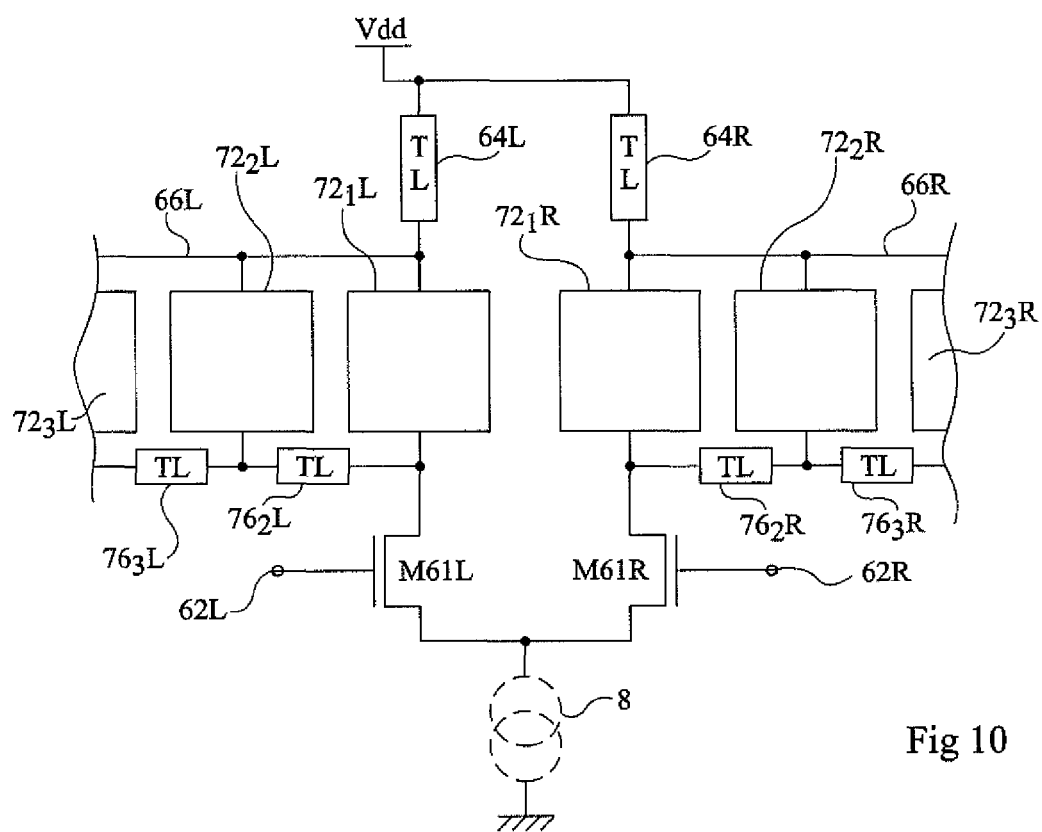
FIG. 10 shows an embodiment of a differential phase-shift amplifier.

FIG. 10 shows another embodiment intended for a differential architecture. The structure described in relation with FIG. 2 or FIG. 5 is repeated for each differential branch. The different elements arbitrarily bear reference letter L or R according to the left-hand or right-hand portion of the differential structure. The transistors of circuits $72_jL$ and $72_jR$ of same rank j are controlled by the same signals to provide the same phase-shift and the same gain over the two differential paths.

As illustrated in FIG. 10, the structure adapts both to a differential or pseudo-differential architecture if a current source 8 (shown in dotted lines in FIG. 10) is interposed between the common sources of transistors M61L and M61R and the ground.

An advantage of the described embodiments is that they enable controlling the phase at the level of the transmit amplifiers or of the receive amplifiers for architectures with adaptive antennas.

Another advantage is that the variable-gain and variable-phase amplifier is directly controllable by digital signals.

Another advantage is that less bulky transmission chains are obtained.

Specific embodiments of the present invention have been described, and different variations and modifications will occur to those skilled in the art. In particular, the selection of the number of phases and of the number of gains of the amplifier depends on the transmission system and on the adaptive antennas. This selection, as well as the angular separation between the different lobes is within the abilities of those skilled in the art according to the application.

Further, the practical implementation of the described embodiments is within the abilities of those skilled in the art based on the functional indications given hereabove.

Moreover, although the present invention has been described in relation with an example applied to an RF transmission chain, the described phase-shift cascode amplifier may find other applications in electronics, for example, in a receiver of super-heterodyne type.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A cascode amplifier comprising at least two phase-shift stages controllable between an input transistor having a control terminal connected to an input terminal of the amplifier, and an output terminal of the amplifier, wherein each phase-shift stage comprises a gain element connected in series with a delay element between said output terminal and said input transistor, each delay element connecting the midpoint of said series connection to the delay element of the stage of previous rank.

2. The amplifier of claim 1, wherein each gain element comprises at least one transistor connecting said output terminal to the delay element of the corresponding stage.

3. The amplifier of claim 1, wherein each gain element comprises several transistors in parallel to make the amplifier gain settable.

4. The amplifier of claim 3, wherein the transistors of the gain elements are MOS transistors.

5. The amplifier of claim 1, wherein the input transistor is a common-source MOS transistor.

6. The amplifier of claim 1, wherein the input transistor is a common-emitter bipolar transistor.

7. A radio with an adaptive antenna, comprising at least one phase-shift amplifier of claim 1.

8. The radio of claim 7, wherein the radio comprises:
  on a transmit side, a first amplifier according to claim 1 forms a first stage of a transmit amplifier; and
  on a receive side, a second amplifier according to claim 1 forms a last stage of a low-noise amplifier.

* * * * *